(12) United States Patent
Hansen

(10) Patent No.: US 9,508,036 B2
(45) Date of Patent: Nov. 29, 2016

(54) HELMET MOUNTABLE TIMED EVENT RFID TAG ASSEMBLY AND METHOD OF USE

(75) Inventor: Kurt S. Hansen, Chesterfield, MO (US)

(73) Assignee: Innovative Timing Systems, LLC, St. Louis, MO (US)

( * ) Notice: Subject to any disclaimer, the term of this patent is extended or adjusted under 35 U.S.C. 154(b) by 355 days.

(21) Appl. No.: 13/980,542

(22) PCT Filed: Jan. 23, 2012

(86) PCT No.: PCT/US2012/022156
§ 371 (c)(1),
(2), (4) Date: Jul. 18, 2013

(87) PCT Pub. No.: WO2012/100243
PCT Pub. Date: Jul. 26, 2012

(65) Prior Publication Data
US 2013/0299590 A1    Nov. 14, 2013

Related U.S. Application Data

(60) Provisional application No. 61/434,723, filed on Jan. 20, 2011.

(51) Int. Cl.
*G06K 19/077* (2006.01)
*A42B 3/04* (2006.01)

(52) U.S. Cl.
CPC ....... *G06K 19/07745* (2013.01); *A42B 3/0433* (2013.01); *G06K 19/07762* (2013.01); *H01L 2924/0002* (2013.01); *Y10T 29/49016* (2015.01)

(58) Field of Classification Search
USPC ....................................................... 235/488
See application file for complete search history.

(56) References Cited

U.S. PATENT DOCUMENTS

| 4,142,680 A | 3/1979 | Oswald et al. |
| 5,091,895 A | 2/1992 | Chatwin et al. |

(Continued)

FOREIGN PATENT DOCUMENTS

| EP | 2009595 A | 12/2008 |
| JP | 2003-327331 A | 11/2003 |

(Continued)

OTHER PUBLICATIONS

PCT Search Report, PCT US 2010-022559, Jan. 29, 2010.

(Continued)

*Primary Examiner* — Michael G Lee
*Assistant Examiner* — David Tardif
(74) *Attorney, Agent, or Firm* — Polster Lieder

(57) ABSTRACT

An RFID tag assembly and method of use with a helmet wherein the RFID tag assembly the RFTD tag assembly includes an RFID tag having a mounting substrate with an exposed first planar surface and an opposing second planar surface, the RFID tag having an RFID semiconductor chip has a predetermined operating frequency with an antenna interface mounted on the second planar surface, a conductor electrically coupled to the antenna interface of the RFID semiconductor chip, and an antenna electrically coupled to the conductor. A spacer has a first surface and an opposing second surface. The first surface of the spacer is attached to the second planar surface of the RFID tag. The spacer has a predetermined thickness between the first surface and the second surface. A mounting carrier has a substantially planar body with a first portion having a first end and a second end with two sides defined therebetween and has one or more second portions extending from the body forming free ends each with a planar top surface and a planar bottom surface, with selectively attachable adhesive on a portion of the bottom surface being deformably attached to the first portion. The second surface of the spacer is attached to the top surface of the first portion with the first planar surface of the RFID tag position parallel and set apart above the top surface of the carrier by a distance equal to or greater than the predetermined thickness of the spacer.

32 Claims, 6 Drawing Sheets

(56) References Cited

U.S. PATENT DOCUMENTS

| | | |
|---|---|---|
| 5,140,307 A | 8/1992 | Rebetez et al. |
| 5,436,611 A | 7/1995 | Arlinghaus, Jr. |
| 5,493,805 A | 2/1996 | Penuela et al. |
| 5,511,045 A | 4/1996 | Sasaki et al. |
| 5,604,485 A | 2/1997 | Lauro et al. |
| 5,696,481 A | 12/1997 | Pejas et al. |
| 5,812,049 A | 9/1998 | Uzi |
| 5,821,902 A | 10/1998 | Keen |
| 5,883,582 A | 3/1999 | Bowers et al. |
| 5,973,598 A | 10/1999 | Beigel |
| 6,008,773 A | 12/1999 | Matsuoka et al. |
| 6,100,804 A | 8/2000 | Brady et al. |
| 6,204,813 B1 | 3/2001 | Wadell et al. |
| 6,278,413 B1 | 8/2001 | Hugh et al. |
| 6,340,932 B1 | 1/2002 | Rodgers et al. |
| 6,369,697 B1 | 4/2002 | Poole |
| 6,466,178 B1 | 10/2002 | Muterspaugh |
| 6,496,806 B1 | 12/2002 | Horwitz et al. |
| 6,512,478 B1 | 1/2003 | Chien |
| 6,570,487 B1 | 5/2003 | Steeves |
| 6,577,238 B1 | 6/2003 | Whitesmith et al. |
| 6,696,954 B2 | 2/2004 | Chung |
| 6,703,935 B1 | 3/2004 | Chung et al. |
| 6,710,713 B1 | 3/2004 | Russo |
| 6,720,930 B2 | 4/2004 | Johnson et al. |
| 6,812,824 B1 | 11/2004 | Goldinger et al. |
| 6,839,027 B2 | 1/2005 | Krumm et al. |
| 6,888,459 B2 | 5/2005 | Stilp |
| 6,888,502 B2 | 5/2005 | Beigel et al. |
| 6,952,157 B1 | 10/2005 | Stewart et al. |
| 6,963,270 B1 | 11/2005 | Gallagher, III et al. |
| 6,989,750 B2 | 1/2006 | Shanks et al. |
| 6,995,655 B2 | 2/2006 | Ertin et al. |
| 7,009,562 B2 | 3/2006 | Jenabi |
| 7,019,639 B2 | 3/2006 | Stilp |
| 7,057,511 B2 | 6/2006 | Shanks et al. |
| 7,057,975 B2 | 6/2006 | Stobbe |
| 7,508,739 B2 | 3/2009 | Paes |
| 7,589,616 B2 | 9/2009 | Klatsmanyi et al. |
| 7,605,685 B2 | 10/2009 | Stewart et al. |
| 7,605,689 B2 | 10/2009 | Hein et al. |
| 8,085,136 B2 | 12/2011 | Stewart et al. |
| 8,179,233 B2 | 5/2012 | Kia |
| 2002/0008622 A1 | 1/2002 | Weston et al. |
| 2002/0008624 A1 | 1/2002 | Paek |
| 2002/0044057 A1 | 4/2002 | Zirbes |
| 2002/0044096 A1 | 4/2002 | Chung |
| 2003/0073518 A1 | 4/2003 | Marty et al. |
| 2003/0163287 A1* | 8/2003 | Vock ................ A43B 3/0005 702/187 |
| 2003/0189484 A1 | 10/2003 | Rust et al. |
| 2004/0006445 A1 | 1/2004 | Paek |
| 2005/0093976 A1 | 5/2005 | Valleriano et al. |
| 2005/0099269 A1 | 5/2005 | Diorio et al. |
| 2006/0097847 A1 | 5/2006 | Bervoets et al. |
| 2006/0097874 A1 | 5/2006 | Salesky et al. |
| 2006/0103536 A1 | 5/2006 | Kwak et al. |
| 2006/0176216 A1 | 8/2006 | Hipskind |
| 2007/0012775 A1* | 1/2007 | Cote ................ B32B 37/02 235/435 |
| 2007/0076528 A1 | 4/2007 | Kirby |
| 2007/0182567 A1 | 8/2007 | Stewart et al. |
| 2007/0252770 A1 | 11/2007 | Kai et al. |
| 2007/0262871 A1 | 11/2007 | Yamagajo et al. |
| 2007/0272011 A1 | 11/2007 | Chapa, Jr. et al. |
| 2008/0018479 A1 | 1/2008 | Hashimoto et al. |
| 2008/0021676 A1 | 1/2008 | Vock et al. |
| 2008/0111695 A1 | 5/2008 | Yamagajo et al. |
| 2008/0139263 A1 | 6/2008 | He et al. |
| 2008/0143620 A1 | 6/2008 | Khatri |
| 2008/0246615 A1 | 10/2008 | Duron et al. |
| 2008/0246616 A1 | 10/2008 | Sakama et al. |
| 2008/0284654 A1 | 11/2008 | Burnside et al. |
| 2008/0316032 A1 | 12/2008 | Kia |
| 2009/0015377 A1 | 1/2009 | Fogg et al. |
| 2009/0184806 A1 | 7/2009 | Kia |
| 2009/0231198 A1 | 9/2009 | Walsh et al. |
| 2010/0019897 A1 | 1/2010 | Stewart et al. |
| 2010/0051701 A1 | 3/2010 | Ogata et al. |
| 2010/0088023 A1 | 4/2010 | Werner |
| 2010/0271263 A1 | 10/2010 | Moshfeghi |
| 2010/0295943 A1 | 11/2010 | Cha et al. |
| 2010/0302910 A1* | 12/2010 | Howell ................ A43B 3/0005 368/10 |
| 2012/0115557 A1 | 5/2012 | Kia |

FOREIGN PATENT DOCUMENTS

| | | |
|---|---|---|
| JP | 2006-004065 A | 1/2006 |
| JP | 2006-053655 A | 2/2006 |
| JP | 2008-276353 A | 11/2006 |
| JP | 2008-299535 A | 12/2008 |
| JP | 4394600 A | 10/2009 |
| JP | 2010-088886 A | 4/2010 |
| JP | 2010-202998 A | 9/2010 |
| JP | 2011-002958 A | 1/2011 |
| KR | 10-2002-0008234 A | 1/2002 |
| KR | 10-2002-0065429 A | 8/2002 |
| KR | 10-0438359 B1 | 7/2004 |
| KR | 10-2006-0078335 A | 7/2006 |
| KR | 10-2007-0092982 A | 9/2007 |
| KR | 10-2008-0090269 A | 10/2008 |
| KR | 10-2010-0100500 A | 9/2010 |
| KR | 10-2010-0119271 A | 11/2010 |

OTHER PUBLICATIONS

PCT Search Report, PCT US 2011-026717, Mar. 1, 2011.
Electronic Product Code (EPC) Tag Data Standards Version 1.1 Rev. 1.24; EPC Global, Inc. Apr. 1, 2004.
Integration of RFID and Cellular Technologies, UCLA, WINMEC 2004; Karali, Sep. 2004.
Alien Debuts Gen 2 Interrogator, RFID Journal; O'Connor, Aug. 4, 2005.
Antenna Design for UHF RFID Tags: A Review and a Practical Application, IEEE Transactions on Antennas and Propagation, vol. 53, No. 12; Rao and Nikitin, Dec. 2005.
Electronic Product Code (EPC) Radio-Frequency Indentity Protocols Class-1 Generation-2 UHF FRID Protocol for Communications at 860 MHz—960 Mhz, Version t0.9; EPC Global, Inc., Jan. 2005.
Electronic Product Code (EPC) Generation 1 Tag Data Standards Version 1.1 Rev.127; EPC Global, Inc., May 10, 2005.
UHF Gen 2 System Overview, TI-RFID; Texas Instruments, Mar. 2005.
Trolleyponder/Ecotag RFID Newsletter, No. 51; Trolley Scan Pty Ltd, Jan. 5, 2006.
Tests on Timing Module for Sports Timing; Trolley Scan Pty, Jun. 2004.
New for 2005—Best Racing now uses DAG chip timing; DAG 2005.
Intermec RFID System Manual; Intermec 2005.
RFID Primer; Alien Technology, 2004.
DAG System Instructions, Version 4; Pygma Lyon (DAG), Jul. 9, 2004.
DAG System Instructions—DAG Triathlon, Version 5; Pygma Lyon (DAG) Jul. 23, 2004.
DAG System—Badgeur V2 Sport Version Datasheet; Pygma Lyon (DAG), Jul. 19, 2004.
Annex 1: Utilization of the Dag Badger System; Pygma Lyon (DAG).
Alien RFID Academy Training Manual; Alien Technology, Sep. 22, 2004.
Alien Advanced RFID Academy; Alien Technology, Mar. 16, 2005.
Reader Interface Guide, V2.1.0; Alien Technology, 2004.
Mobile RFID Reader with Database Wireless Synchronization, S. Sandoval-Reyes, et al, 2nd ICEEE and CIE2005, Mexico City, Sep. 7-9, 2005.
Tag Programming Guide, Nanoscanner Reader v01.02.01, Alien Technology, 2003.

(56) References Cited

OTHER PUBLICATIONS

Mitigating the Reader Collision Problem in Rfid Networks with Mobile Readers, Shailesh M. Birair and Sridhar Iyer, Indian Institute of Technology, Mumbai, India, 400 076, IEEE, 2005.
PCT Search Report, PCT US 2011-020901, Jan. 11, 2011.
PCT Search Report, PCT US 2011-020905, Jan. 11, 2011.
PCT Search Report, PCT US 2011-046032, Jul. 29, 2011.
PCT Search Report, PCT US 2011-050570, Sep. 6, 2011.
PCT Search Report, PCT US 2012-022156, Jan. 23, 2012.
PCT Search Report, PCT US 2012-022126, Jan. 20, 2012.
PCT Search Report, PCT US 2012-022125, Jan. 20, 2012.
PCT Search Report, PCT US 2012-022132, Sep. 14, 2012.

* cited by examiner

HELMET MOUNTABLE TIMED EVENT RFID TAG ASSEMBLY AND METHOD OF USE

CROSS-REFERENCE TO RELATED APPLICATIONS

This application is a National Stage of International Application No. PCT/US12/22156, filed Jan. 23, 2012 that claims the benefit of U.S. Provisional Application No. 61/434,723, filed on Jan. 20, 2011 entitled ARTICLE AND METHOD OF A HELMET MOUNTABLE RFID TAG FOR A TIMED EVENT, the disclosures of which is incorporated herein by reference.

FIELD

The present disclosure relates radio frequency identification ("RFID") tags and, more specifically, to a helmet mountable event participant RFID timing chip.

BACKGROUND

The statements in this section merely provide background information related to the present disclosure and may not constitute prior art.

One of the greatest challenges in reading RFID tags that are placed on a surface of a moving object in a timed event such as a race, wherein such object surface absorbs RF energy as utilized by the RFID tag. When an RFID tag is placed near a medium that absorbs RF energy, the operational ability and/or operating range of the RFID tag can be negatively impacted. For example, an RFID tag placed on or in close proximity to the human body of the event participant is subject to the interaction of the RF signal to and from the RFID tag and the negative impacts of the body on such RF signals. The RF signal strength received by or transmitted from the RFID tag can be reduced by water or other foreign materials such as dirt or mud that comes in contact with, or in very close proximity to, an RFID tag, or the body of the participant in proximity to the RFID tag. RF absorption from an RFID tag placed in proximity to a human body or on or near a vehicle can significantly limit the operation of the RFID tag, and thereby negatively impact the ability for an RFID tag reader to effectively and accurately read the tag of the participant for identifying the participant and making a determination of the participants time of passing an event detection point.

In addition, RFID tags are often not contained in rigid or protected enclosures. Thus, damage can easily occur to an RFID tag that will affect its ability to communicate properly. All or some of these conditions can prevent an RFID tag from providing a high level of read accuracy in a harsh environment, such as at a sporting event.

SUMMARY

The inventor hereof has identified the need and advantages of providing an assembly for an RFID tag having an extended tag operating range that functions well when positioned in close proximity to a moving event participant wearing a helmet, such a bicycle or motorcycle or any similar event wherein tracking and/or locating the participant using an RFID chip is desired. The is particular useful when structures are near to the RFID chip that inherently absorb RF energy and/or that is configured to operate in a variety of operating environments including those that may be harsh. The inventor hereof has succeeded at designing assemblies and methods for operating an RFID tag that is capable of use in such operating environments with easy placement on a participant's helmet during the event.

According to one aspect, an RFID tag assembly for use in tracking or timing of the progress of a user wearing a helmet is disclosed. The RFID tag assembly includes a mounting substrate with an exposed first planar surface and an opposing second planar surface. The RFID tag has an RFID semiconductor chip having a predetermined operating frequency with an antenna interface mounted on the second planar surface, a conductor electrically coupled to the antenna interface of the RFID semiconductor chip, and an antenna electrically coupled to the conductor. A mounting carrier provides for attachment to an outer portion of the helmet. The mounting carrier has a first portion having an upper surface and a lower surface and at least one second portion pivotally coupled to the first portion. At least one free end extends from the first portion and has an upper surface and a lower surface. The second planar surface of the RFID tag is fixedly attached to the upper surface of the first portion. Each second portion is selectably deformable in relation to the pivotally coupled first portion and has a selectively attachable adhesive on the bottom surface of at least a portion of the extending second portion. A spacer has a first surface and an opposing second surface with a predetermined thickness between the first surface and the second surface. The second planar surface of the RFID tag is fixedly attached via the first surface of the spacer being attached to the second planar surface of the RFID tag and the second surface of the spacer being attached to the upper surface of the first portion of the mounting carrier.

According to another aspect, a method of operating a radio frequency identification (RFID) tag assembly as described in the immediate preceding paragraph, includes attaching the described RFID tag assembly to an operating surface of a piece of equipment used by an event participant, the operating surface of the equipment piece having an outer surface and an inner surface and one or more openings extending through the outer surface towards the inner surface and defining an intermediate surface therebetween. The method also includes orienting a first portion of the RFID tag assembly along the outer surface of the operating surface, and folding at least one second portion along a fold line between the first portion and second portion of the RFID tag assembly. The method further includes threading the at least one second portion of the RFID tag assembly through one of openings from the outer surface proximate towards the inner surface and selectively securing the at least one second portion of the RFID tag assembly to at least one of the intermediate surface and the inner surface of the operating surface of the piece of equipment.

According to yet another aspect, the RFID tag assembly includes an RFID tag having a mounting substrate with an exposed first planar surface and an opposing second planar surface, the RFID tag having an RFID semiconductor chip has a predetermined operating frequency with an antenna interface mounted on the second planar surface, a conductor electrically coupled to the antenna interface of the RFID semiconductor chip, and an antenna electrically coupled to the conductor. A spacer has a first surface and an opposing second surface. The first surface of the spacer is attached to the second planar surface of the RFID tag. The spacer has a predetermined thickness between the first surface and the second surface. A mounting carrier has a substantially planar body with a first portion having a first end and a second end with two sides defined therebetween and has one or more second portions extending from the body forming free ends each with a planar top surface and a planar bottom surface. Each also has a selectively attachable adhesive on a portion of the bottom surface and is deformably attached to the first portion. The second surface of the spacer is attached to the top surface of the first portion with the first planar surface of the RFID tag position parallel and set apart above the top surface of the elongated central body of the carrier by a distance equal to or greater than the predetermined thickness of the spacer.

According to still another aspect, a method of operating a radio frequency identification (RFID) tag assembly of the immediately preceding paragraph includes attaching the described RFID tag assembly to an operating surface of a piece of equipment used by an event participant, the operating surface of the equipment piece having an outer surface and an inner surface and one or more openings extending through the outer surface towards the inner surface and defining an intermediate surface therebetween. The method also includes orienting a first portion of the RFID tag assembly along the outer surface of the operating surface and folding at least one second portion along a fold line between the first portion and second portion of the RFID tag assembly. The method further includes threading the at least one second portion of the RFID tag assembly through one of openings from the outer surface proximate towards the inner surface and selectively securing the at least one second portion of the RFID tag assembly to at least one of the intermediate surface and the inner surface of the operating surface of the piece of equipment.

Further aspects of the present disclosure will be in part apparent and in part pointed out below. It should be understood that various aspects of the disclosure might be implemented individually or in combination with one another. It should also be understood that the detailed description and drawings, while indicating certain exemplary embodiments, are intended for purposes of illustration only and should not be construed as limiting the scope of the disclosure.

BRIEF DESCRIPTION OF THE DRAWINGS

It should be understood that throughout the drawings, corresponding reference numerals indicate like or corresponding parts and features.

DETAILED DESCRIPTION

The following description is merely exemplary in nature and is not intended to limit the present disclosure or the disclosure's applications or uses.

Before turning to the figures and the various exemplary embodiments illustrated therein, a detailed overview of various embodiments and aspects is provided for purposes of breadth of scope, context, clarity, and completeness.

Figure 1:
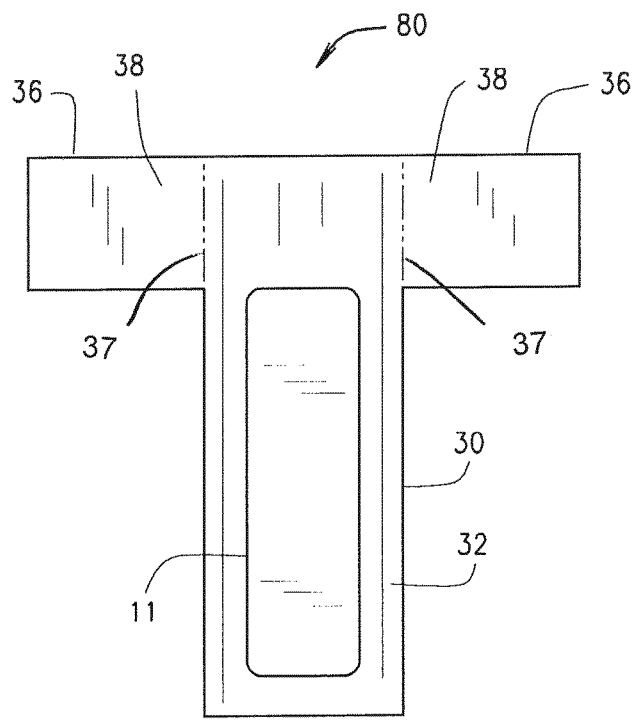
FIG. 1 is a schematic view of an RFID tag assembly having an RFID tag according to a first exemplary embodiment.

Referring to FIG. 1, a schematic view of an RFID tag assembly 80 having an RFID tag 11 according to a first exemplary embodiment is shown. The RFID tag assembly 80 has a first portion 30 including an upper surface 32 and a lower surface 34 and at least one second portion 36 pivotally coupled to and having a free end extending from the first portion 30. The assembly 80 can include one or more fold lines 37 for pivotally coupling the second portions 36 to the first portion 30. Each second portion 36 includes an upper surface 38 and a lower surface 40. The second planar surface 42 of the RFID tag 11 is fixedly attached to the upper surface 32 of the first portion 30. Each second portion 36 is selectably deformable in relation to the pivotally coupled first portion 30. The bottom surface 40 of each second portion 36 has a selectively attachable adhesive. Any suitable adhesive can be used, including but not limited to contact cement. Typically, the adhesive would be applied to the bottom surface 40 of each second portion 36 prior to an event, and covered with a backing that would be removed when the RFID tag assembly 80 is mounted to the Helmet 42. However, the adhesive can be applied at the time the RFID tag assembly 80 is mounted to the Helmet 42.

The first 30 and second 34 portions of the RFID tag assembly 80 can be formed from any material of suitable strength and durability to protect the RFID tag 11 and remain securely attached to the Helmet 42 in the event environment and that is sufficiently flexible to allowing mounting as described herein. Potential material includes cardboard, Mylar® (Mylar is a registered trademark of DuPont Teijin Films) or other flexible plastics and vinyl tape.

The RFID tag assembly 80 of FIG. 1 also includes an RFID tag 11 having a mounting substrate 16 with an exposed first planar surface 82 and an opposing second planar surface 84. The RFID tag 11 has an RFID semiconductor chip 12 having a predetermined operating frequency with an antenna interface mounted on the second planar surface 84, a conductor 14 electrically coupled to the antenna interface of the RFID semiconductor chip 12, and an antenna 18 electrically coupled to the conductor 14.

As shown in FIG. 1, the RFID tag assembly 80 is generally T-shaped, with two second portions 36 extending from opposite sides of one end of the first portion 30. One skilled in the art will appreciate that the RFID tag assembly 80 can be formed in any shape, and any number of second portions 36 could be used without departing from the scope of the present disclosure. For example, the shape of the RFID tag assembly 80 can be modified to accommodate mounting on different variants of helmets or other devices used by a participant. Further, the shape of the RFID tag assembly 80 may serve an ornamental function, for instance to accommodate a particular theme for an event such as a holiday or charitable cause. Similarly, the number and placement of second portions 36 can be adjusted to accommodate mounting on different variants of helmets or other devices used by a participant.

Figure 2:
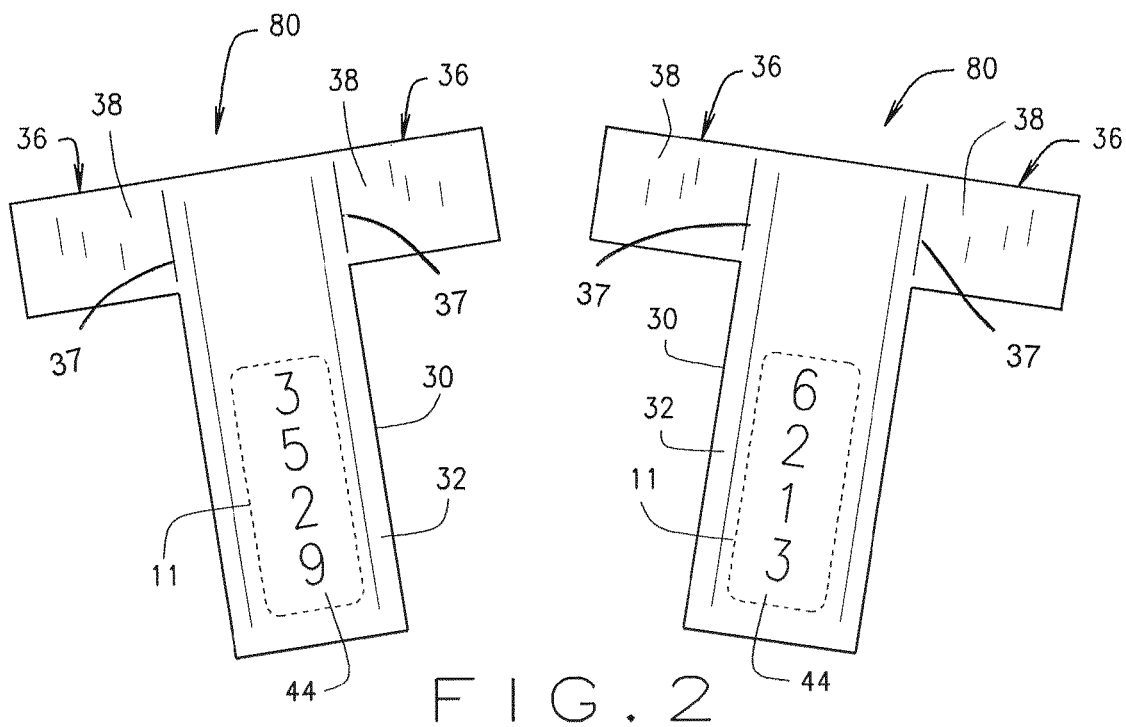
FIG. 2 is top perspective view of the RFID tag assembly of FIG. 1, according to a first exemplary embodiment.

In FIG. 2, a top perspective view of the RFID tag assembly 80 of FIG. 1, according to a first exemplary embodiment, is illustrated. The RFID tag assembly 80 may contain desired indicia 44, such as the name of the manufacturer of the RFID tag assembly 80, a participant identifier, or instructions for mounting the RFID tag assembly 80.

Figure 3:
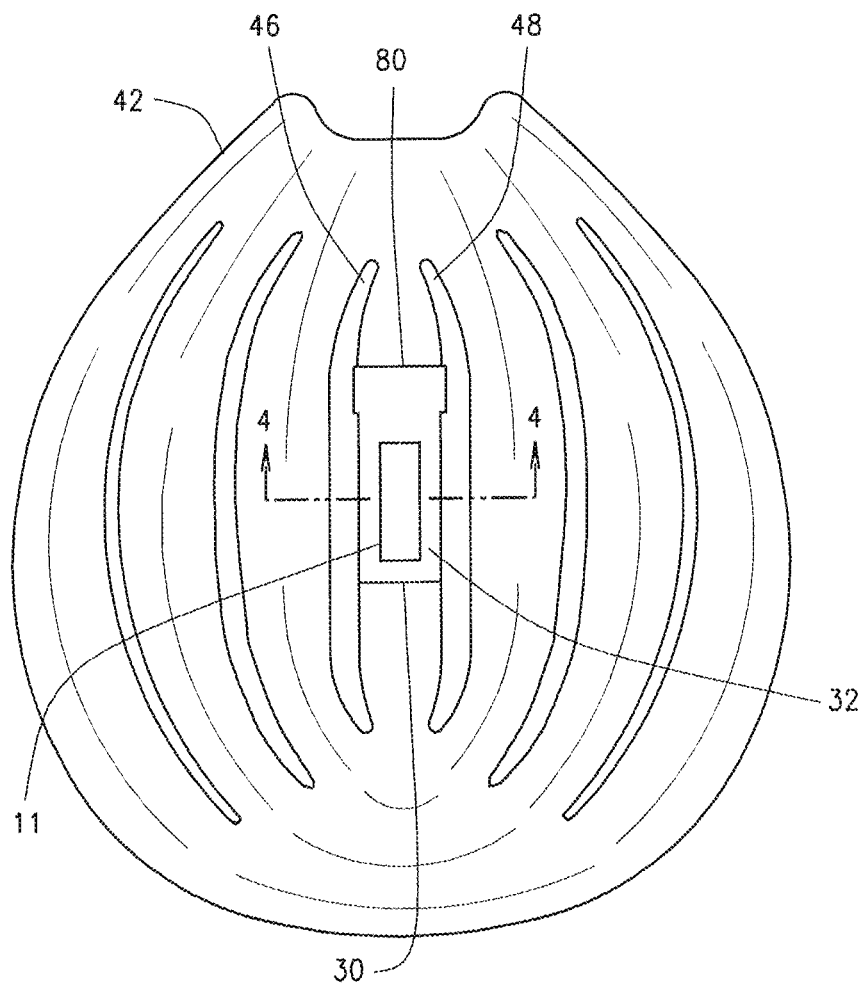
FIG. 3 is an illustration of an RFID tag assembly having an RFID tag, showing the RFID tag assembly attached to a participant's helmet according to another exemplary embodiment.

FIG. 3 illustrates an RFID tag assembly 80 having an RFID tag 11, showing the RFID tag assembly 80 attached to a participant's Helmet 42 according to another exemplary embodiment. The RFID tag assembly 80 is generally mounted on the top of the Helmet 42, with the first portion 30 running along the top of the Helmet 42 in a generally front to back direction. One second portion 36 of the RFID tag assembly 80 is inserted through Helmet Vent A 46, folded along a fold line 37 as shown in FIG. 1, and secured to an underside surface 50 of the Helmet 42 using an adhesive. Another second portion 36 is applied in a similar fashion using Helmet Vent B 48. In this manner, the RFID tag assembly 80 is securely attached to the Helmet 42.

Figure 4:
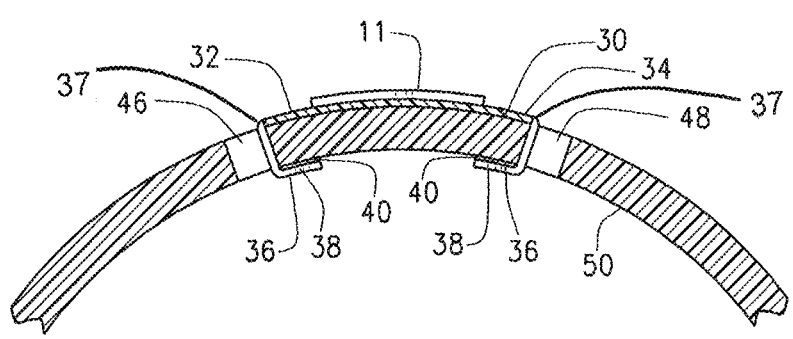
FIG. 4 is a side cross-sectional view of the RFID tag assembly attachment to a participant's helmet, according to the exemplary embodiment of FIG. 3.

FIG. 4 shows a side cross-sectional view of the RFID tag assembly 80 attachment to a participant's helmet 42, according to the exemplary embodiment of FIG. 3. The RFID tag assembly 80 including the RFID tag 11 is mounted above the Helmet's upper surface. The two second portions 36 are shown being folded at fold lines 37 and extending through Helmet Vent A 46 and B 48, respectively, folding around an underside surface 50 of the Helmet 42. The two second portions 36 are secured to underside surface 50 of the Helmet 42 using an adhesive.

In another embodiment, an RFID tag assembly 80 for use in tracking or timing of a progress of a user includes an RFID tag 11 having a mounting substrate 16 with an exposed first planar surface 15 and an opposing second planar surface 17. At least one of the first 15 and second 17 planar surfaces is adapted for selective attachment to a carrier surface. The RFID tag 11 has an RFID semiconductor chip 12 that is any type of RFID chip and can have a predetermined operating frequency and an antenna interface mounted on the at least one of the first 15 and second 18 planar surfaces. A conductor 14 is electrically or conductively coupled to the antenna interface of the RFID semiconductor chip 12 and an antenna 18 is electrically coupled to the conductor. As shown, the antenna 18 can be a bipolar foil antenna. The RFID semiconductor chip 12 and the conductor 14 can each be formed on the mounting surface of the mounting substrate 16. Similarly, the antenna 18 can be formed on one of the surfaces 15, 17 of the mounting substrate 16 as a foil antenna. The mounting substrate 16 can be any suitable mounting material including a polyester (PET) film.

A spacer 62 composed of a foam material is attached to the second planar surface 17. The foam material is composed of a material that is non-conducting and non-absorbing of a substantial amount of energy at the predetermined operating frequency. The spacer 62 can be positioned for placement between a surface of the body of the user and the RFID tag 11 for positioning at a minimum spaced apart distance from the surface of the body of the user during operation of the RFID tag assembly 80. The spacer can be attached to the first 15 or second planar surface 17 of the mounting substrate 16 by an adhesive material or as otherwise suitable for the application. The spacer 62 can be dimensioned to have a spaced apart distance between the operating surface of the body of the user and the mounting substrate 16 that is greater than or equal to about ¼ of a wavelength of the predetermined operating frequency. For example, in one exemplary embodiment the spacer 62 is dimensioned to have a spaced apart distance between a surface of the user body and the mounting substrate 16 of between about 0.125 inches and about 0.5 inches.

Figure 9:
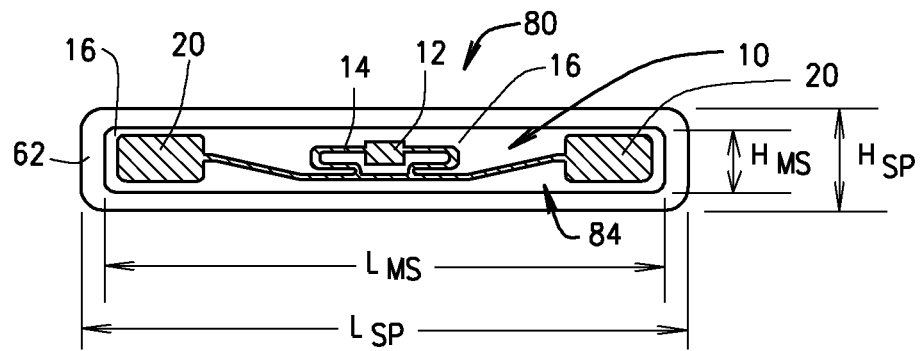
FIG. 9 is a top view of an RFID tag assembly illustrating the dimensions of the RFID tag in relationship to the dimensions of the foam insert according to one exemplary embodiment.

The mounting substrate 16 of the RFID tag assembly 80 can be a substantially planar mounting substrate having a length, a width and a thickness. The thickness of the mounting substrate 16 can be the distance between the first planar surface 15 and the opposing second planar surface 17. The length of the spacer 62 can be a length and width that is substantially equal to or greater than the length and width of the RFID tag assembly mounting substrate 16, respectively. As such, the spacer 62 can encircle or enclose the mounting substrate 16. An example of an RFID tag assembly 80 is shown in FIG. 9. As shown, the length of the spacer LSP is greater than the length of the mounting substrate LMS and the height of the spacer HSP is greater than the height of the mounting substrate HMS.

The assembly can also include a mounting body having the carrier surface thereon. The carrier surface can be composed of a non-permeable material and the at least one planar surface is attached to the carrier surface. In such embodiments, the spacer can also be composed of a waterproof non-permeable foam material, such as a high density foam material and/or one having a closed cell structure. As such, the attached spacer and attached carrier surface can provide a substantially moisture proof sealing of the RFID tag assembly from external foreign substances and moisture. The sizing of the spacer and the carrier surface can ensure that the RFID tag assembly is completely enclosed and protected. For example, a helmet is provided as a mounting body for selective attachment of the RFID tag assembly to a participant.

In another embodiment, a method of operating a radio frequency identification (RFID) tag assembly includes mounting a mounting substrate with an RFID semiconductor chip at a spaced apart distance from an operating surface at a distance greater than or equal to about ¼ of a wavelength of a predetermined operating frequency of a radio frequency energy. The operating surface being a surface associated with a body composed of a material that absorbs a substantial amount of energy at the predetermined operating frequency. The method also includes receiving at a first side of a two sided planar antenna coupled to an RFID semiconductor chip mounted in proximity to the operating surface a first portion of that radio frequency energy as transmitted from an antenna associated with a base station transceiver positioned remote from the RFID tag assembly. The first side is oriented away from the operating surface. The method further includes receiving at a second side of the two-sided planar antenna a second portion of the radio frequency energy transmitted from the base station transceiver antenna. The second portion of the radio frequency energy is received at the predetermined operating frequency. The second side is oriented towards the operating surface. The method also includes processing the received first and second portions of the radio frequency energy by the RFID semiconductor chip. The method further includes generating a reply radio frequency energy at the RFID semiconductor chip at a predetermined reply operating frequency in response to the processing and in response to the first and second received radio frequency energy portions. The method includes radiating the reply radio frequency energy by both the first side and the second side of the two-sided planar antenna.

Figure 5:
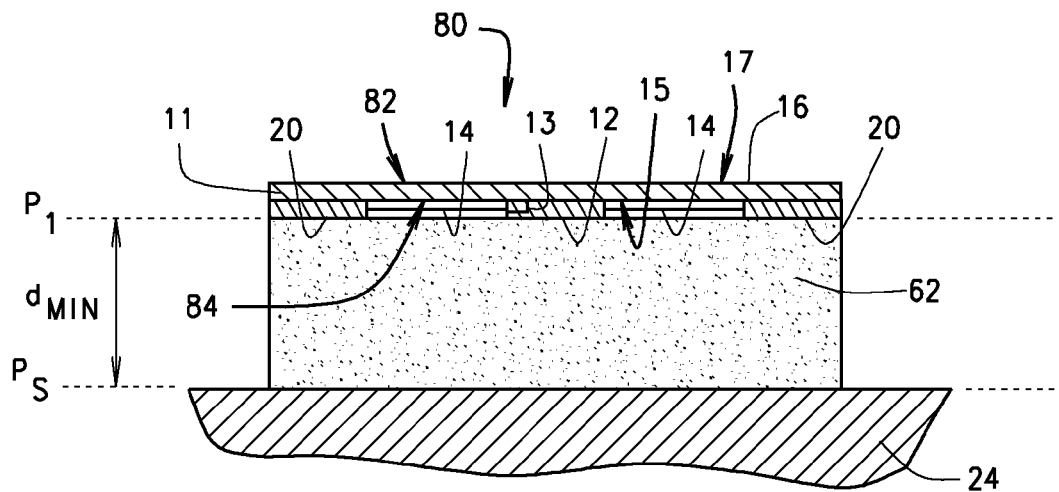
FIG. 5 is a side cross-sectional view of an RFID tag assembly having a foam spacer according to yet another exemplary embodiment.
Figure 10:
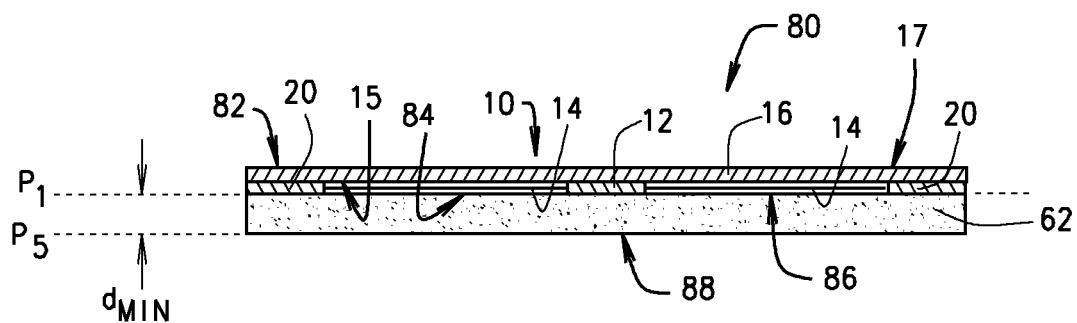
FIG. 10 is a side cross-sectional view of an RFID tag assembly according to another exemplary embodiment.

Referring to the two exemplary embodiments illustrated in FIGS. 5 and 10, an RFID tag assembly 80 includes an RFID tag 11 includes an RFID semiconductor chip 12 with an antenna interface (not shown), a conductor 14 and a bipolar antenna 18, which is shown as two first radiating elements 20, and a mounting substrate 16 that has a first surface 82 and a second surface 84. The RFID semiconductor chip 12, conductor 14 and two first radiating elements 20 are each mounted on the second surface 84. A foam spacer 62 is attached to the second surface 15 and about the mounted RFID semiconductor chip 12, conductor 14, and two first radiating elements 20. The spacer 62 can have a thickness such as a minimum thickness of $d_{min}$ such that the spacer spaces the two first radiating elements 20 apart from the surface plane PS of an operating surface 24. However, in some embodiments, $d_{min}$ can be the sum of the thickness of the spacer, and any other expected nonconductive material that is expected to be present between the first plane P1 containing the first radiating elements and the operating surface. As such, the thickness of the spacer can be less than the ¼ wavelength or the total $d_{min}$ in some embodiments.

Figure 6:
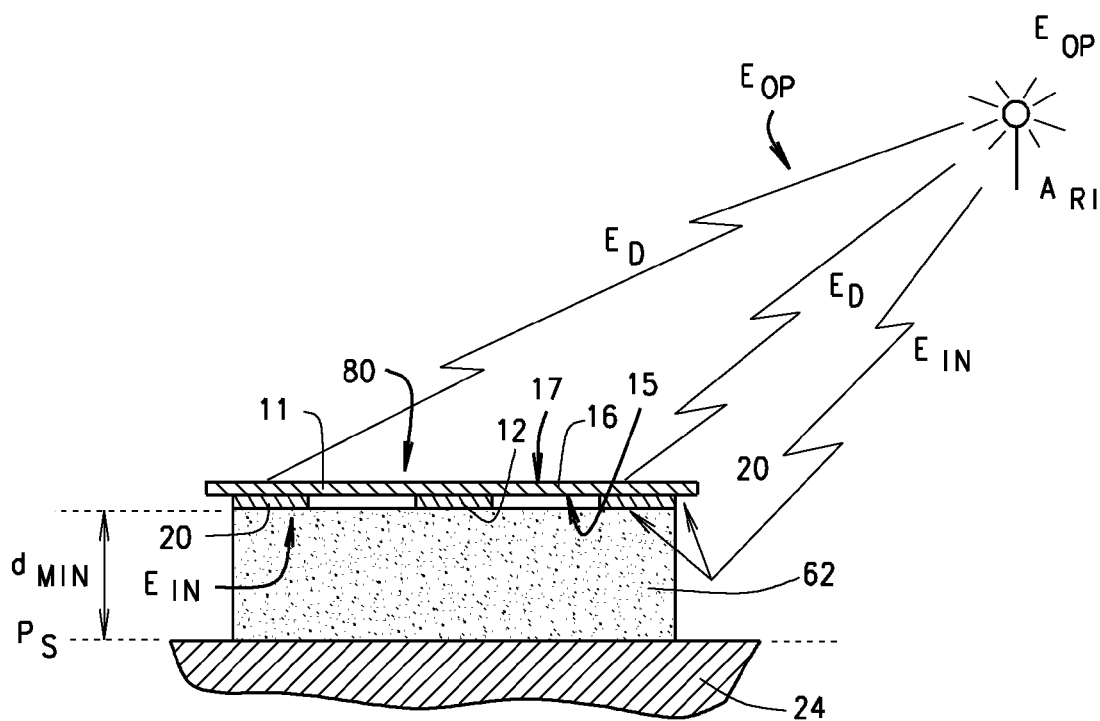
FIG. 6 is a side cross-sectional view of an RFID tag assembly having a foam spacer according to another exemplary embodiment.

In operation, as illustrated by example in FIG. 6, operating energy EOP is propagated between a transceiver antenna AR1 and one or both of the first radiating elements 20. As shown in this embodiment, there is no carrier or attachment surface. This includes direct propagated energy ED and indirect propagated energy EIN. As shown, the amount of indirect propagated energy EIN can be enhanced by dimensioning of the spacer thickness $d_{min}$. This can also include reducing the absorption of the indirect propagated energy EIN by the spaced apart positioning caused by the spacer thereby limiting the negative effect of energy absorption by the operating surface 24.

Figure 7:
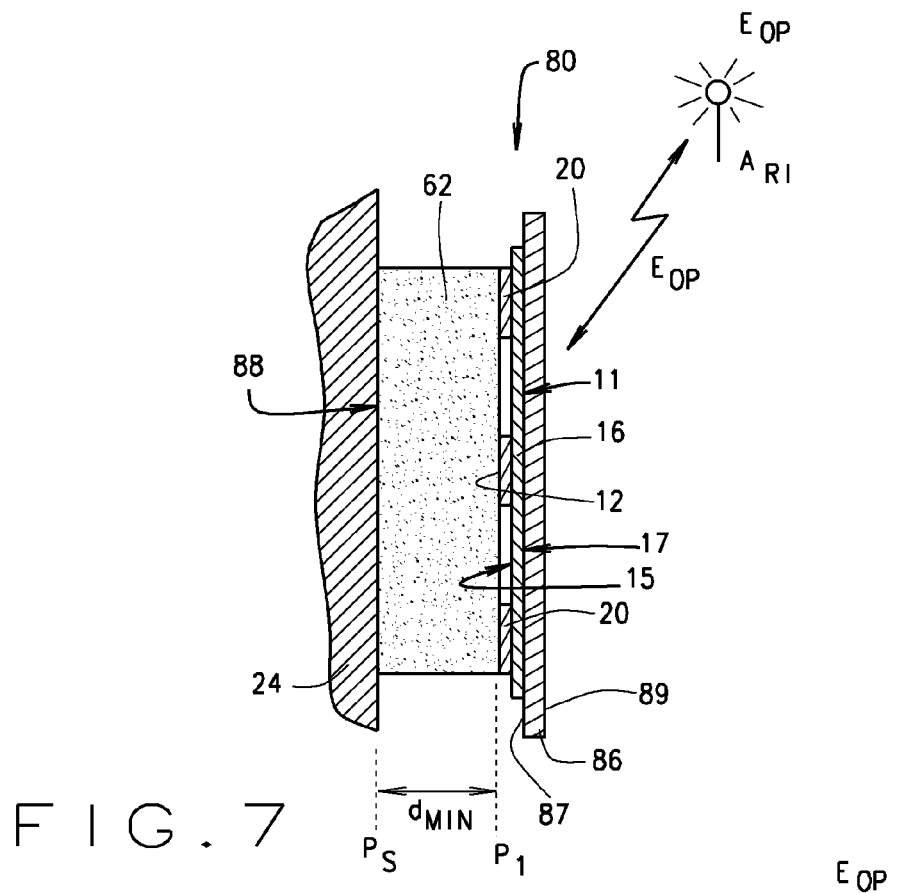
FIGS. 7 and 8 are side cross-sectional views of two RFID tag assemblies mounted on a racing bib as a mounting surface and in relationship to an operating surface according to two additional exemplary embodiments.

In another embodiment, as shown in FIG. 7, the RFID tag assembly 10 is attached to a carrier 86 that has a front planar surface 89 and an opposing carrier surface 87. The RFID tag assembly 10 is attached by an adhesive (not shown) that is one the first surface 17 of the mounting substrate 16 that is opposite of the second surface 15 on which the RFID tag assembly components are mounted. The spacer 62 is attached as in the embodiment of FIG. 6 and has an outer surface 88 that is positioned for engagement against the operating surface 24 for ensuring that the minimum distance $d_{min}$ is maintained during operation.

Figure 8:
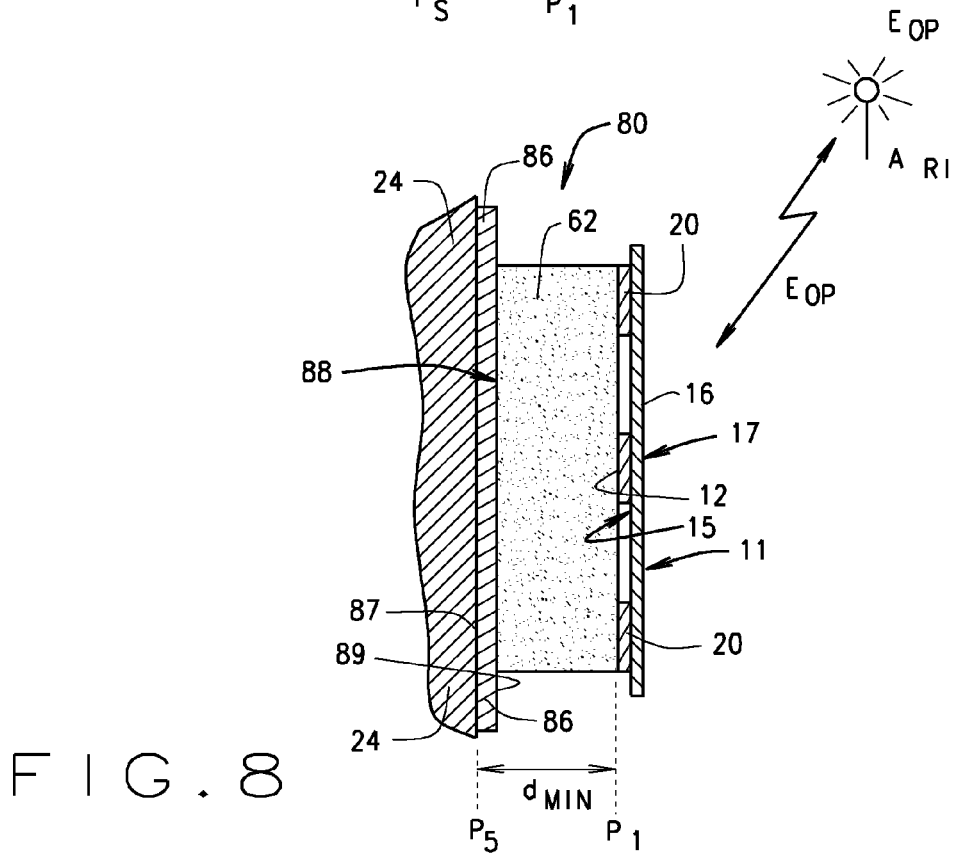

FIG. 8 illustrates another embodiment where with the carrier 86 being positioned between the RFID tag assembly 10 and the operating surface 24. In this embodiment, the spacer 62 is attached similarly to that described in FIGS. 5 and 6; however, the outer surface of the spacer 62 is attached to the outer surface 89 of the carrier 86 rather than the opposing carrier surface 87. In this manner, the thickness of the carrier and the thickness of the spacer 62 combine to provide for ensuring the minimum distance $d_{min}$ is maintained.

Figure 11:
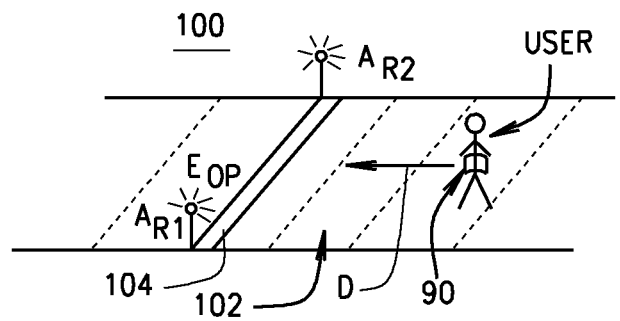
FIG. 11 is a perspective view of an operating environment for an RFID tag assembly for use in timing the progress of a user in a racing event according to one exemplary embodiment.

FIG. 11 is a perspective view of an operating environment for an RFID tag assembly 80 such as for timing the progress of a user in a racing event using a racing bib 90 as illustrated in FIG. 15A or 15B, by way of examples. As shown, the racing bib 90 is worn by the user whom is running along track 102 and approaching timing point 104. Timing point 104 may be any timing point and can include a finish line of track 102. Transceiver antenna $A_{R1}$ and $A_{R2}$ are mounted proximate to the timing point 104 for exchanging operating energy $E_{OP}$ with the RFID tag assembly 80 mounted on the bib 90.

Figure 12:
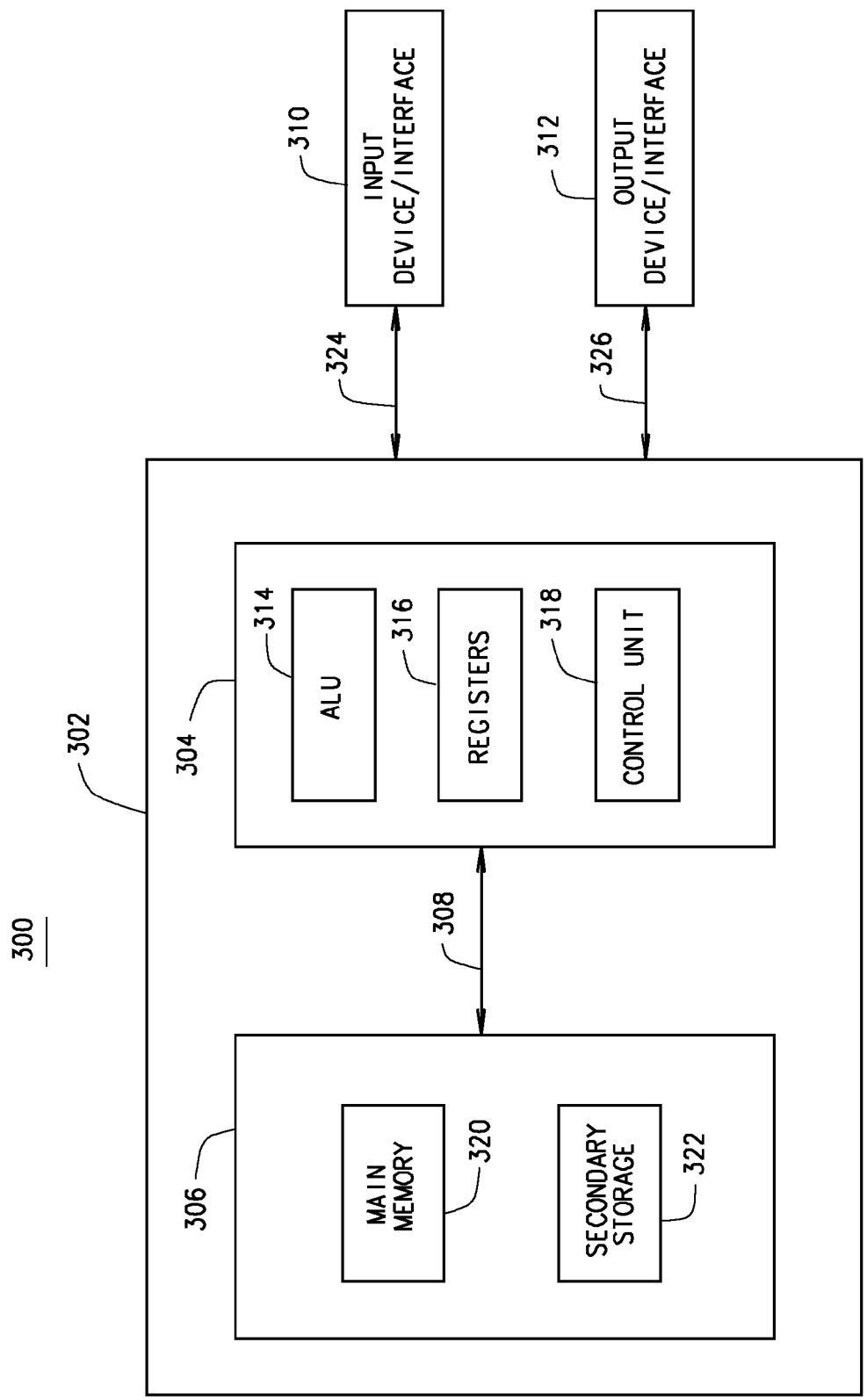
FIG. 12 is a block diagram of a specialized computer system suitable for implementing one or more assembly or methods of various embodiments as described herein.

Referring to FIG. 12, an operating environment for an illustrated embodiment of the an RFID semiconductor chip and/or remote transceiver is a computer system 300 with a computer 302 that comprises at least one high speed processing unit (CPU) 304, in conjunction with a memory system 306 interconnected with at least one bus structure 308, an input device 310, and an output device 312. These elements are interconnected by at least one bus structure 308. As addressed above, the input and output devices can include a communication interface including an antenna interface.

The illustrated CPU 304 for an RFID semiconductor chip is of familiar design and includes an arithmetic logic unit (ALU) 314 for performing computations, a collection of registers for temporary storage of data and instructions, and a control unit 316 for controlling operation of the computer system 300. Any of a variety of processors, including at least those from Digital Equipment, Sun, MIPS, Motorola, NEC, Intel, Cyrix, AMD, HP, and Nexgen, is equally preferred but not limited thereto, for the CPU 304. The illustrated embodiment operates on an operating system designed to be portable to any of these processing platforms.

The memory system 306 generally includes high-speed main memory 320 in the form of a medium such as random access memory (RAM) and read only memory (ROM) semiconductor devices that are typical on an RFID semiconductor chip. However, the present disclosure is not limited thereto and can include secondary storage 322 in the form of long term storage mediums such as RAM or flash memory, and other devices that store data using electrical, magnetic, and optical or other recording media. The main memory 320 also can include, in some embodiments, a video display memory for displaying images through a display device (not shown). Those skilled in the art will recognize that the memory system 306 can comprise a variety of alternative components having a variety of storage capacities.

Where applicable, while not typically provided on RFID tags or chips, an input device 310, and output device 312 can also be provided. The input device 310 can comprise any keyboard, mouse, physical transducer (e.g. a microphone), and can be interconnected to the computer 302 via an input interface 324 associated with the above described communication interface including the antenna interface. The output device 312 can include a display, a printer, a transducer (e.g. a speaker), etc., and be interconnected to the computer 302 via an output interface 326 that can include the above described communication interface including the antenna interface. Some devices, such as a network adapter or a modem, can be used as input and/or output devices.

As is familiar to those skilled in the art, the computer system 300 further includes an operating system and at least one application program. The operating system is the set of software that controls the computer system's operation and the allocation of resources. The application program is the set of software that performs a task desired by the user, using computer resources made available through the operating system. Both are typically resident in the illustrated memory system 306 that may be resident on the RFID semiconductor chip.

In accordance with the practices of persons skilled in the art of computer programming, portions of the present disclosure as described herein are made with reference to symbolic representations of operations, processes or methods that are performed by the computer system 300. Such operations are commonly referred to as being "computer-executed." One of ordinary skill in the art will appreciate having reviewed this disclosure that one or more of the operations can be symbolically represented to include the manipulation by the CPU 304 of electrical signals representing data bits and the maintenance of data bits at memory locations in the memory system 306, as well as other processing of signals. The memory locations where data bits are maintained are physical locations that have particular electrical, magnetic, or optical properties corresponding to the data bits. One or more portions or functions of the RFID timing chip as disclosed herein can be implemented in a program or programs, comprising a series of instructions stored on a computer-readable medium. The computer-readable medium can be any of the devices, or a combination of the devices, described above in connection with the memory system 306.

When describing elements or features and/or embodiments thereof, the articles "a", "an", "the", and "said" are intended to mean that there are one or more of the elements or features. The terms "comprising", "including", and "having" are intended to be inclusive and mean that there may be additional elements or features beyond those specifically described.

Those skilled in the art will recognize that various changes can be made to the exemplary embodiments and implementations described above without departing from the scope of the disclosure. Accordingly, all matter contained in the above description or shown in the accompanying drawings should be interpreted as illustrative and not in a limiting sense.

It is further to be understood that the processes or steps described herein are not to be construed as necessarily requiring their performance in the particular order discussed or illustrated. It is also to be understood that additional or alternative processes or steps may be employed.

What is claimed is:

1. An RFID tag assembly for use in tracking or timing of a progress of a user wearing a helmet having two or more elongated vents, the assembly comprising:
   an RFID tag having a mounting substrate with an exposed first planar surface and an opposing second planar surface, the RFID tag having an RFID semiconductor chip having a predetermined operating frequency with an antenna interface mounted on the second planar surface, a conductor electrically coupled to the antenna interface of the RFID semiconductor chip, and an antenna electrically coupled to the conductor;
   a mounting carrier for attachment to an outer portion of the helmet, the mounting carrier having a first planar portion having and elongated body with two opposing ends and two opposing sides and an upper surface and a lower surface and at least two second planar portions lying substantially in the same plane as the first planar portion and pivotally coupled to the opposing sides of the first portion with each having a free end extending from the first portion with an upper surface and a lower surface and each dimensioned for insertion through one of the vents of the helmet, the second planar surface of the RFID tag being fixedly attached to the upper surface of the first portion along the elongated body, each second portion being selectably deformable in relation to the pivotally coupled first portion and having a selectively attachable adhesive on the lower surface of the free end of the extending second portion that is dimensioned for insertion through one of the helmet vents; and
   a spacer having a first surface and an opposing second surface and having a predetermined thickness between the first surface and the second surface, wherein the second planar surface of the RFID tag is fixedly attached via the first surface of the spacer being attached to the second planar surface of the RFID tag and the second surface of the spacer being attached to the upper surface of the first portion of the mounting carrier.

2. The assembly of claim 1 wherein the spacer is composed of a foam material that is non-conducting and non-absorbing of a substantial amount of energy at the predetermined operating frequency.

3. The assembly of claim 1 wherein there are two second portions of the mounting carrier extending from opposing sides of the first portion at one of the ends of the first portion and forming a T-shape.

4. The assembly of claim 3 wherein the first portion has an elongated body with a first side and an opposing second side defined between the first end and the second end and each of the two second portions are positioned on opposing different sides of the first portion.

5. The assembly of claim 4 wherein the two second portions are positioned on the two opposing sides of the elongated body of the first portion and are positioned proximate to at least one of the first end and the second end of the first portion.

6. The assembly of claim 1 wherein the RFID tag includes a unique RFID tag number and at least one of the first planar surface of the RFID tag and the upper surface of the mounting carrier includes indicia including a unique identification number corresponding to the RFID tag number.

7. The assembly of claim 1 wherein the upper surface of the mounting carrier includes an adhesive fixedly attaching the RFID tag to the upper surface of the first portion.

8. The assembly of claim 1 wherein the antenna is a bipolar foil antenna formed on one of the surfaces of the mounting substrate composed of a polyester (PET) film and the RFID semiconductor chip is a passive RFID chip and wherein the conductor is formed on the second planar surface of the mounting substrate.

9. The assembly of claim 1 wherein the predetermined operating frequency of the RFID chip is a frequency within a UHF frequency band and the spacer is dimensioned to have the predetermined thickness to position the antenna of the RFID chip at a distance of greater than or equal to 3.18 inches to 3.27 inches from the body of the user when the RFID tag assembly is attached to the helmet for use in tracking or timing the progress of the user.

10. The assembly of claim 1 wherein the spacer is composed of a high density closed cell foam material and has a predetermined thickness dimensioned to space the antenna of the RFID tag apart from the outer portion of the helmet on which the mounting carrier is attached by between about 0.125 inches and about 0.5 inches.

11. The assembly of claim 1 wherein each of the second portions is pivotally coupled to the first portion at a preformed fold line and wherein at least a portion of the selectably deformable second portion includes the pivotally coupling of the second portion to the first portion at the fold line.

12. The assembly of claim 1 wherein each second portion is composed of a flexible material and dimensioned to have a length so that the free end extends beyond the under surface of the helmet when inserted through the helmet vent and the free end of each second portion is configured for folding around an underside surface of the helmet after insertion of the second portion through one of the helmet vents.

13. The assembly of claim 12 wherein the free end of the second portion that is folded around the underside surface of the helmet is the portion of the free end of the extending second portion having the selectively attachable adhesive on the lower surface.

14. The assembly of claim 1 wherein the spacer is composed of a high density closed cell foam material and encloses the mounting substrate and the RFID tag thereon.

15. The assembly of claim 1 wherein the body of the mounting carrier is composed of a non-permeable material and the at least one planar surface is attached to the carrier surface; the spacer being composed of a waterproof non-permeable foam material, said attached spacer and attached carrier surface providing a sealing of the RFID tag assembly from external foreign substances and moisture.

16. An RFID tag assembly for use in tracking or timing of a progress of a participant wearing a helmet having two or more elongated vents, the assembly comprising:
   an RFID tag having a mounting substrate with an exposed first planar surface and an opposing second planar surface, the RFID tag having an RFID semiconductor chip having a predetermined operating frequency with an antenna interface mounted on the second planar surface, a conductor electrically coupled to the antenna interface of the RFID semiconductor chip, and an antenna electrically coupled to the conductor;
   a spacer having a first surface and an opposing second surface, the first surface of the spacer being attached to the second planar surface of the RFID tag, the spacer having a predetermined thickness between the first surface and the second surface; and
   a mounting carrier with a substantially planar body with a first planar portion having an elongated body with a first end and a second end and two opposing sides defined therebetween and having two or more second planar portions lying substantially in the same plane as the first planar portion extending outward from the two opposing sides of the elongated body of the first portion forming free ends and each having a planar top surface and a planar lower surface and a selectively attachable adhesive on at least a portion of the lower surface, and wherein each second portion is deformably attached to the opposing sides of the first portion,
   the second surface of the spacer being attached to the top surface of the first portion of the mounting carrier with the first planar surface of the RFID tag positioned parallel and set apart above the top surface along the elongated body of the first portion of the mounting carrier by a distance equal to or greater than the predetermined thickness of the spacer.

17. The assembly of claim 16 wherein the mounting carrier has a substantially planar body with two second portions forming a top portion of a T-shape.

18. The assembly of claim 16 wherein the spacer is composed of a foam material that is non-conducting and non-absorbing of a substantial amount of energy at the predetermined operating frequency.

19. The assembly of claim 16 wherein the mounting carrier has two second portions extending from opposing sides of the first portion.

20. The assembly of claim 19 wherein the two opposing sides are positioned proximate to at least one of the first end and the second end.

21. The assembly of claim 16 wherein the RFID tag includes a unique RFID tag number and at least one of the first planar surface of the RFID tag and the upper surface of the mounting carrier includes indicia having a unique identification number corresponding to the RFID tag number.

22. The assembly of claim 16 wherein the lower surface of the free ends of the two or more second portions of the mounting carrier are the portion of the lower surface that has the selectively attachable adhesive.

23. The assembly of claim 16 wherein the antenna is a bipolar foil antenna formed on one of the surfaces of the mounting substrate formed from polyester (PET) film and a passive RFID semiconductor chip and conductor are formed on the mounting surface of the mounting substrate.

24. The assembly of claim 16 wherein the predetermined operating frequency of the RFID chip is a frequency within a UHF frequency band and the spacer is dimensioned to have the predetermined thickness of greater than or equal to 3.18 inches to 3.27 inches from the body of the user when the RFID tag assembly is attached to the helmet for use in tracking or timing the progress of the user.

25. The assembly of claim 16 wherein the spacer has a predetermined thickness dimensioned to space the antenna of the RFID tag apart from the outer portion of the helmet on which the mounting carrier is attached by between about 0.125 inches and about 0.5 inches.

26. The assembly of claim 16 wherein the mounting substrate of the RFID tag assembly is substantially planar having a length, a width and a thickness, the thickness being defined by the distance between the first planar surface and the opposing second planar surface, and wherein the spacer has a length and width substantially equal to or greater than the length and width of the RFID tag assembly mounting substrate, respectively.

27. The assembly of claim 26 wherein the spacer is composed of a high density closed cell foam material and encloses the mounting substrate and the RFID tag thereon.

28. The assembly of the claim 16 wherein the spacer wherein the spacer is composed of a high density closed cell foam material and is attached to the second planar surface of the mounting substrate by an adhesive material.

29. The assembly of claim 16 wherein the body of the mounting carrier is composed of a non-permeable material and the at least one planar surface is attached to the carrier surface; the spacer being composed of a waterproof non-permeable foam material, said attached spacer and attached carrier surface providing a sealing of the RFID tag assembly from external foreign substances and moisture.

30. The assembly of claim 16 wherein the mounting carrier includes a preformed fold line positioned where at least one second portion extends from the first portion of the body.

31. The assembly of claim 16 wherein each second portion is composed of a flexible material and dimensioned to have a length so that the free end extends beyond the under surface of the helmet when inserted through the helmet vent and the free end of each second portion is configured for folding around an underside surface of the helmet after insertion of the second portion through one of the helmet vents.

32. The assembly of claim 31 wherein the free end of the second portion that is folded around the underside surface of the helmet is the portion of the free end of the extending second portion having the selectively attachable adhesive on the lower surface.

\* \* \* \* \*